United States Patent

[11] 3,593,070

[72] Inventor Bruce S. Reed
Dallas, Tex.
[21] Appl. No. 784,315
[22] Filed Dec. 17, 1968
[45] Patented July 13, 1971
[73] Assignee Texas Instruments Incorporated
Dallas, Tex.

[54] SUBMOUNT FOR SEMICONDUCTOR ASSEMBLY
3 Claims, 2 Drawing Figs.

[52] U.S. Cl. .......... 317/234 R, 317/234 A, 317/235 AQ, 317/235 AD
[51] Int. Cl. .......... H01l 1/12, H01l 15/00
[50] Field of Search .......... 317/234/1, 235/43, 235/48.4, 235 R, 234 R, 234 A, 235 AD, 235 AQ

[56] References Cited
UNITED STATES PATENTS

| | | | |
|---|---|---|---|
| 3,361,868 | 1/1968 | Bachman | 174/52 |
| 3,414,968 | 12/1968 | Genser | 29/577 |
| 3,283,221 | 11/1966 | Heiman | 317/235 |
| 3,440,114 | 3/1969 | Harper | 148/187 |

*Primary Examiner*—John W. Huckert
*Assistant Examiner*—Martin H. Edlow
*Attorneys*—Samuel M. Mims, Jr., James O. Dixon, Harold Levine, Andrew M. Hassell, John G. Graham, Melvin Sharp, Henry T. Olsen, Michael A. Sileo, John E. Vandigriff and Gary C. Honeycutt

ABSTRACT: A radiant diode assembly s provided with a thermally conductive, electrically nonconductive submount, in combination with a metallic heat sink mounting member, thereby permitting series interconnection of the individual units of a multipl1Diode array. Gold-doped silicon is the preferred submount, having a gold content of about $10^{16}$ atoms per $cm.^3$, a thermal conductviity of about 6 watts per cm. per °k., and an electrical resistivity of about 20,000 ohm-cm. at an operating temperature of about 80°K. to 120°K.

BRUCE S. REED
INVENTOR

BY Gary C. Honeycutt
ATTORNEY

SUBMOUNT FOR SEMICONDUCTOR ASSEMBLY

This invention relates to the assembly of semiconductor devices, and more particularly to a thermally conductive, electrically insulated heat sink subassembly for semiconductor devices, including radiant diodes, for example.

A multiple-unit array of radiant diodes must be provided with efficient means for heat dissipation. It has been the usual practice to connect the anode of each diode of such an array with a heat sink member, both thermally and electrically, which inherently provides a parallel electrical interconnection of the complete array. A need has now developed for a multiple-diode array electrically interconnected in series. In order to provide such an assembly, each diode must be electrically insulated from the heat sink member, without sacrificing efficient heat dissipation.

Accordingly, it is an object of the present invention to provide a semiconductor assembly having thermally efficient, electrically insulated means for heat dissipation; and more particularly, it is an object of the invention to provide a radiant diode assembly having a thermally efficient, electrically insulated heat dissipation subassembly, adapted for series electrical interconnection of the individual units of a multiple-diode array.

The invention is embodied in a semiconductor assembly comprising a monocrystalline semiconductor structure electrically insulated from, and thermally secured to an efficient heat sink subassembly. The subassembly includes a metallic heat sink mounting member having a thermally conductive, electrically nonconductive submounting member secured thereto, and having a metallized surface opposite the heat sink. The semiconductor structure is thermally and electrically secured to the metallized surface of the submount, in a position such that the metallized area extends beyond the perimeter of the semiconductor structure to permit external ohmic connection.

In a preferred embodiment, the semiconductor assembly of the invention includes a copper heat sink having a gold-doped silicon submounting member, one surface of which is thermally secured to the copper heat sink, and having an opposite surface provided with an alloyed ohmic contact pattern adapted for the mounting of a radiant diode thereon. A gallium arsenide diode, for example, having ohmic contacts adapted for registry with the contact pattern of said submount member, is thermally and electrically secured thereto, providing a thermally efficient, electrically isolated means for heat dissipation.

FIG. 1

Figure 1:
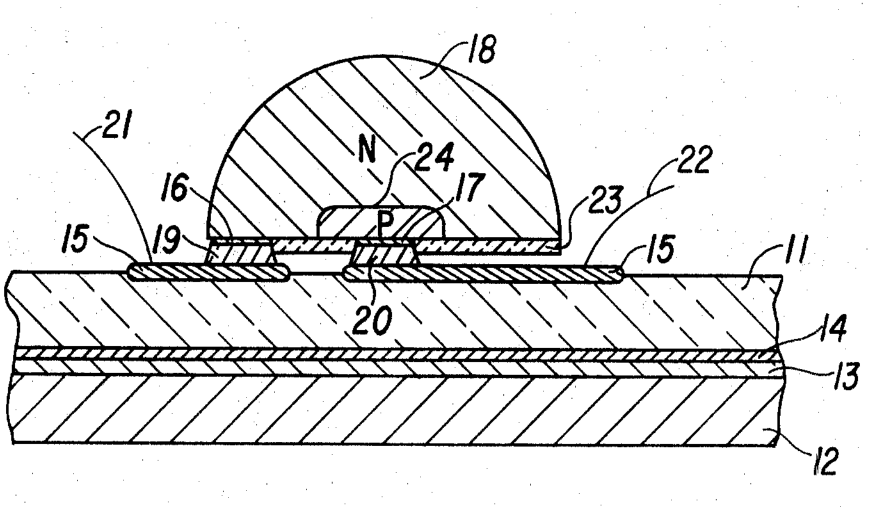
FIG. 1 is an elevational view in cross section of a preferred embodiment of the invention.

As shown in FIG. 1, a gold-doped silicon submount member 11 is secured to copper heat sink 12 by means of solder layer 13. The submount is provided with a gold-alloyed surface 14 to enhance its solderability. Any suitable solder may be used, including, for example, a solder comprised of 95 percent tin and 5 percent silver. The opposite surface of submount 11 is provided with a gold-alloy contact pattern 15 for the purpose of establishing electrical contact with electrodes 16 and 17 of gallium arsenide diode 18 mounted thereon, through solder connections 19 and 20. External electric connection is provided by wires 21 and 22. Oxide insulation 23, formed during the fabrication of diode 18, is retained thereon for the purpose of electrically insulating and passivating junction 24.

Although other thermally conductive, electrically resistive submount members, such as beryllium oxide, could be employed, gold-doped silicon submount 11 has been found particularly useful, not only because of its high thermal conductivity and electrical resistivity, but also because it has a coefficient of thermal expansion which matches the gallium arsenide structure. In addition, it is readily amenable to the formation of fine-geometry gold-alloy ohmic contact patterns. It is easily adapted for solderability to the copper stud, and it can be used in the form of much thinner slices than most ceramic materials.

A suitable submount must have an electrical resistivity of at least about 5,000 ohm-cm., and a thermal conductivity of at least 1 watt per cm. per ° K., at a typical operating temperature of about 80° K. to 120°K. Also, the coefficient of thermal expansion must be approximately the same as that of the semiconductor structure to be mounted thereon. Additional tolerance to thermal stresses may be obtained by inserting a molybdenum slice between submount 11 and heat sink 12.

Figure 2:
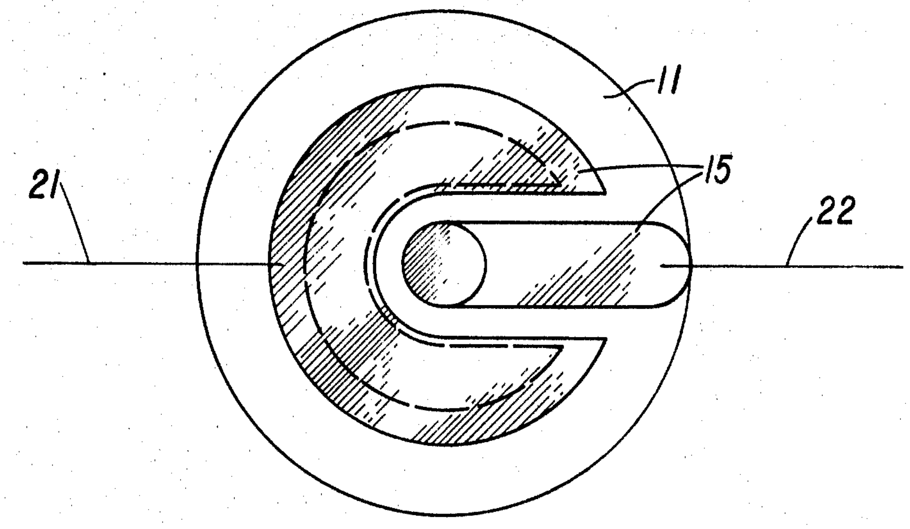
FIG. 2 is a plan view of the submounting member, showing a preferred ohmic contact pattern

In FIG. 2, a plan view of submount member 11 illustrates the preferred geometry of alloy contact pattern 15. The dashed outline thereon shows a suitable mounting position for the ohmic contact areas of the gallium arsenide diode. It will be apparent that exact orientation is not required in order to obtain suitable contact of electrodes 16 and 17 with the corresponding portions of pattern 15. Large area contacts are useful, since they provide the primary path for thermal dissipation.

Although gallium arsenide is disclosed as a preferred radiant diode, other semiconductor diodes are suitable, including particularly gallium antimonide, indium phosphide, indium arsenide, indium antimonide, and mixed crystals of two or more of these compounds, including for example, Ga(AsP), (InGa)As, and In(PAs). Other semiconductor structures are also within the scope of the invention, including silicon and germanium devices, such as diodes and transistors, for example.

What I claim is:

1. A semiconductor assembly comprising in combination:
a. a metallic heat sink;
b. a thermally conductive, electrically nonconductive gold-doped silicon submounting member secured to said heat sink, said submounting member having a first plurality of electrically isolated metallized areas opposite said heat sink;
c. a monocrystalline semiconductor substrate, said substrate having at least one semiconductor device formed therein, said semiconductor device having a second plurality of electrically isolated metallized areas selectively connected to said semiconductor device; wherein
d. said semiconductor substrate is positioned such that said first plurality of metallized areas selectively contact said second plurality of metallized areas and are bonded thereto, said second plurality of metallized areas extending beyond the perimeter of said semiconductor substrate to permit external connections thereto.

2. A semiconductor assembly in accordance with claim 1, wherein said semiconductor device is a radiant diode.

3. A radiant diode device comprising:
a. a thermally conductive major mounting member;
b. a gold-doped silicon submounting member thermally secured to said major mounting member, and having first and second metallized areas on a surface opposite said major mounting member; and
c. a radiant semiconductor diode having a region of P-type conductivity thermally and electrically secured to said first metallized area, and a region of N-type conductivity thermally and electrically secured to said second metallized area, said metallized areas extending beyond the perimeter of said diode to permit external electric connections.